United States Patent [19]
Moscony et al.
[11] 3,833,375
[45] Sept. 3, 1974

[54] METHOD OF REPAIRING AN IMPERFECT PATTERN OF METALIZED PORTIONS ON A SUBSTRATE

[75] Inventors: John Joseph Moscony, Lancaster; Ronald Lester Kennard, Landisville, both of Pa.
[73] Assignee: RCA Corporation, New York, N.Y.

[22] Filed: Mar. 9, 1972
[21] Appl. No.: 233,247

[52] U.S. Cl. ........................ 96/36.2, 96/38.3, 156/8, 156/15
[51] Int. Cl. .............................................. G03c 5/00
[58] Field of Search ............ 156/8, 11, 15; 117/212; 96/36.2, 38.3

[56] References Cited
UNITED STATES PATENTS

| | | | |
|---|---|---|---|
| 3,498,833 | 3/1970 | Lehrer | 117/212 |
| 3,649,274 | 3/1972 | Older et al. | 96/36.2 |
| 3,672,925 | 6/1972 | Feldstein | 96/36.2 X |
| 3,753,816 | 8/1973 | Feldstein et al. | 156/11 |

*Primary Examiner*—David Klein
*Assistant Examiner*—Edward C. Kimlin
*Attorney, Agent, or Firm*—G. H. Bruestle; W. S. Hill

[57] ABSTRACT

The method comprises treating a pattern of metalized portions on a substrate which were deposited using a photomasking technique, to render the metal thereon more etch-resistant, then sensitizing and activating at least a part of the treated area on the substrate including an area containing imperfectly formed metalized portions, for autocatalytic deposition of more of the metal, depositing a coating of the metal over the treated area by autocatalytic deposition, defining the portions to be repaired by photomasking and etching techniques preferably using the same mask used to define the original pattern of metalized portions, and etching away unwanted portions of the last-deposited metal without removing any substantial amount of the first-deposited metal portions.

5 Claims, 6 Drawing Figures

PATENTED SEP 3 1974 3,833,375

METHOD OF REPAIRING AN IMPERFECT PATTERN OF METALIZED PORTIONS ON A SUBSTRATE

BACKGROUND

There are numerous industrial applications which require forming a pattern of metal-plated portions on an insulated substrate. One such application is printed circuits. Another application is making metal photomasks. Photomasks may be used in many different manufacturing operations such as the fabrication of the shadow mask used in one type of color TV picture tube.

Most electronics industry applications using photomasks require that the photomasks be capable of high resolution, be 100% complete with no parts missing, and have good wearing qualities.

It has previously been found that metal photomasks can be made by electroless deposition of nickel alloy on glass substrates. It was found that this type of mask can be made with satisfactory resolution, good uniformity, good adherence to substrate and good abrasion resistance. However, in making photomasks with hundreds of thousands of metal dots by electroless deposition of nickel, it was found that it was extremely difficult to make a mask which did not have at least a few missing dots and/or some dots incompletely formed. The missing dots and the malformed dots could not be tolerated because, wherever a metal dot was missing or malformed on the mask, a corresponding imperfection appeared on the shadow mask and also on the cathode ray tube viewing screen. Even small imperfections on the viewing screen are both visible and annoying to the viewer. There has been need for a simple, reliable way to repair the metal photomasks in order for the masks to be successfully used in manufacturing.

DESCRIPTION OF PREFERRED EMBODIMENT

Figure 1:
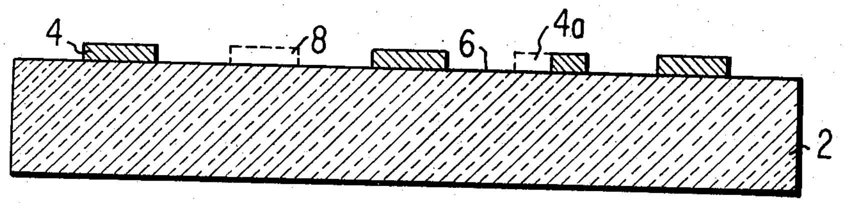
FIG. 1 is a cross-section view of a part of a photomask having imperfect portions to be repaired by the method of the present invention.

Although the method is applicable to many different types of articles, it will be illustrated in the repairing of a photomask. This photomask comprises a glass substrate 2, one-fourth inch thick, having a multitude of nickel dots 4 on a surface 6 thereof. These dots have been deposited by conventionally sensitizing and activating the surface 6 of the substrate 2 and then depositing a layer of nickel over the entire surface 6 by an autocatalytic technique. An example of a suitable bath for depositing the metal comprises 65g./L of nickel sulfamate, $Ni(SO_3NH_2)_2$, and 15 g./L of sodium hypophosphite, $NaH_2PO_2$, buffered to a pH of 4 with a combination of citric acid and sodium citrate. The bath is maintained at about 50° C. About 1,000 A thickness of metal deposits in about 20 minutes. The nickel layer actually comprises a nickel-phosphorus alloy.

The dots 4 were formed by depositing an overall layer of metal, covering the metal layer with a photoresist, exposing the photoresist through a photomask, developing the exposed photoresist to remove the more soluble portions, and then etching away the metal which has been uncovered by the removal of portions of the photoresist.

In depositing the pattern of dots 4 it is assumed that there are some dots 8 missing. A missing dot 8 is indicated in dotted outline. It is also assumed that some of the dots are formed imperfectly. A missing portion of a dot is indicated at 4*a* in dotted outline.

In order to modify the dots 4 so that missing dots can be replaced and malformed dots can be repaired in accordance with the present method, the dots 4 are first given a bake at 340°–380° C in air for about one hour. This modifies the nickel-phosphorous alloy so that it becomes much more resistant to common etchants such as dilute hydrochloric acid and dilute nitric acid.

The area of the plate to be repaired is now thoroughly cleaned using, for example, a 0.1 percent aqueous detergent solution, and the cleaned surface is thoroughly rinsed with water. If the missing or imperfect dots are on localized areas of the plate, those areas can be surrounded with a dam of wax or other suitable adherent, insoluble material.

The cleaned surface is then sensitized by treating it for about one-half to one minute in a solution comprising 40–70 grams per liter of $SnCl_2 \cdot 2H_2O$ and 50 ml per liter of concentrated hydrochloric acid. In addition, this solution preferably contains a detergent such as Trend in the concentration range of 0.01 to 0.1 percent by weight. It has been found, in accordance with this invention, that a relatively high concentration of stannous chloride is required in the sensitizing solution in order to sensitize the nickel dot pattern completely. If the nickel surface is not completely sensitized, it is attacked by the palladium solution which is used later, as described below. If electrochemical attack by palladium occurs, the initial nickel plating is degraded. Also, the relatively high tin concentration of the sensitizing bath appears to reduce hydrochloric acid attack on the nickel. After sensitizing, the plate is thoroughly rinsed with warm deionized water.

The sensitized surface 6 of the plate 2 is then activated by treating it for about one-half to 1 minute with a solution containing 0.5 gram per liter of $PdCl_2$ and 0.5 ml per liter of concentrated hydrochloric acid. The plate is then thoroughly rinsed with warm deionized water. If the entire plate is being treated (perhaps because the number of defects is large) it is preferred to immerse it in the palladium solution with an inert gas atmosphere, such as argon, over the solution.

Figure 2:
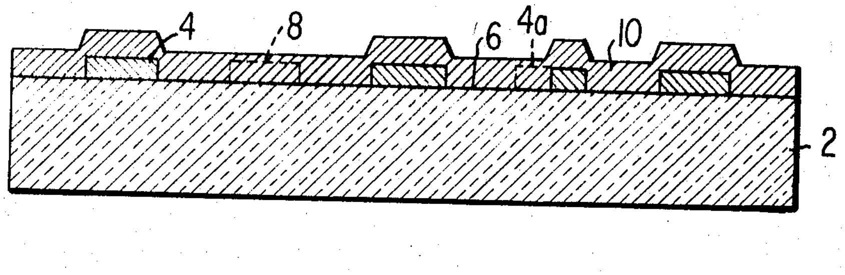
FIGS. 2, 3, 4 and 5 are similar cross-section views illustrating successive steps in the method of the present invention.

Next, the activated surface of the plate is treated for 5–10 minutes at 30° C using the same nickel bath previously described except that the nickel sulfamate concentration is reduced to 30 g./L. As shown in FIG. 2, this results in an over-all nickel coating 10 being deposited on at least the area to be repaired. After the nickel coating 10 is deposited, the glass plate is removed from the bath and rinsed with warm water. Alternatively, the bath is removed from the plate portion being treated. It may be also dried in a stream of compressed air.

In order to partially harden the newly deposited nickel coating 10, the plate may either be baked at about 250° C for one hour or permitted to stand for a period of 24 hours at room temperature.

Figure 3:
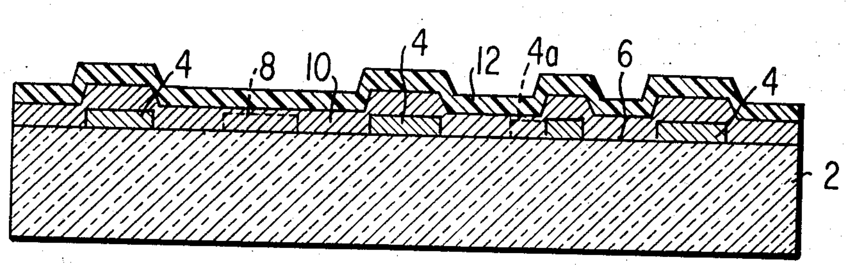
Figure 4:
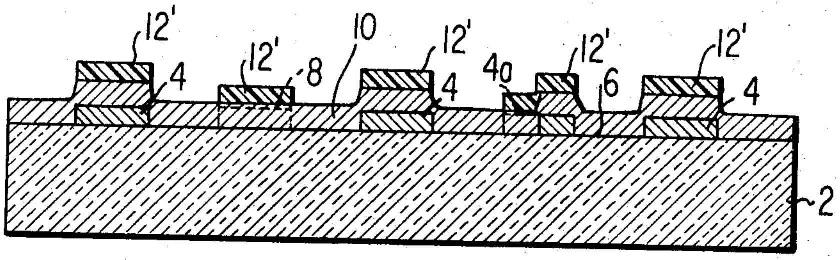

Next, (FIG. 3), a coating 12 of photoresist is applied over the entire surface of the nickel coating 10. Using the same master (or one with exactly the same pattern) that was used for depositing the original pattern of nickel dots 4, the photoresist coating 12 is exposed and the resist is developed. This leaves patches (FIG. 4) of hardened photoresist 12' covering the original dots 4, locations 8 where missing dots are to be inserted, and locations 4*a* where imperfect dots are to be built up.

Figure 5:
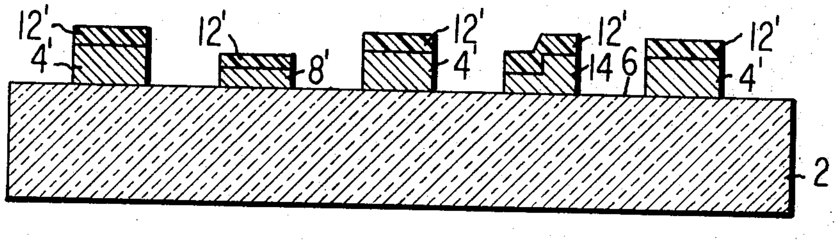

The next step is to apply an etching solution such as 50 percent nitric acid or dilute hydrochloric acid for 1 to 5 minutes to the entire area being treated. This removes (FIG. 5) all parts of the nickel coating 10 not covered with patches of photoresist 12'. The plate now has the original pattern of nickel dots 4' which have been increased in thickness by an added layer of nickel, single thickness dots 8' where dots were missing, and built up dots 14 which are now complete.

Figure 6:
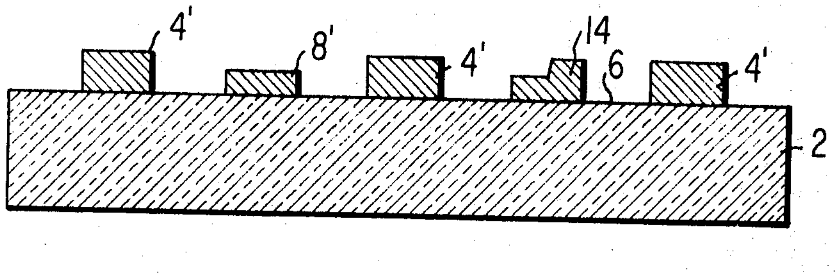
FIG. 6 is a cross-section view of the repaired portion of the photomask illustrated in FIG. 1.

Finally, the patches of hardened photoresist 12' are removed (FIG. 6) with a suitable solution and the plate is baked at 340°–380° C for at least one hour to further harden the nickel deposit, make it more abrasion-resistant and also to make it more adherent.

If more than one repair cycle is needed, the steps may be repeated until all dots are complete.

Although the second coating of nickel increases the thickness of the dots already deposited, this does not introduce any problem in using the completed mask because the total thickness of the metal dots is very small compared to thickness variations in the glass plate.

We claim:

1. A method of repairing an imperfect pattern of precisely spaced metal portions adherent on the surface of an etch-resistant substrate where said portions had been photolithographically defined, by depositing an overall layer of the metal on the substrate, covering the metal layer with a photoresist, and exposing the photoresist through a mask, said portions being of a metal capable of autocatalytic electroless deposition on said substrate, said method comprising:

treating said metal portions to make them more resistant to a particular etchant by heating them at a temperature of 340°–380° C in air, sensitizing a part of said surface, including the imperfect metal portions to be repaired and portions adjacent thereto, with a solution of $SnCl_2 \cdot 2H_2O$ and hydrochloric acid, activating the sensitized surface by treating it with an acidified solution of palladium chloride, depositing a coating of said metal autocatalytically on the activated surface, partially hardening the metal coating, applying a coating of photoresist over the hardened metal coating, exposing said photoresist coating using the same mask which was used to photolithographically define said pattern of metal portions, developing the exposed photoresist coating thereby uncovering parts of the metal coating between the pattern portions, etching the uncovered portions of the metal coating with said etchant to remove them, and removing the remaining portions of said resist.

2. A method according to claim 1 in which said metal is a nickel-phosphorous alloy.

3. A method according to claim 1 in which said substrate is glass.

4. A method according to claim 1 in which said activating treatment is carried out by dipping the entire substrate in said palladium solution with an inert gas atmosphere over the solution.

5. A method according to claim 1 in which said etchant is either dilute hydrochloric or dilute nitric acid.

* * * * *